United States Patent
Kim et al.

(10) Patent No.: US 7,960,219 B2
(45) Date of Patent: Jun. 14, 2011

(54) THIN-FILM TRANSISTOR SUBSTRATE AND METHOD OF FABRICATING THE SAME

(75) Inventors: Woong-Kwon Kim, Cheonan-si (KR);
In-Woo Kim, Suwon-si (KR); Ki-Hun Jeong, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 12 days.

(21) Appl. No.: 12/575,570

(22) Filed: Oct. 8, 2009

(65) Prior Publication Data
US 2010/0109008 A1    May 6, 2010

(30) Foreign Application Priority Data

Nov. 5, 2008  (KR) .......................... 10-2008-0109411

(51) Int. Cl.
*H01L 21/00*   (2006.01)

(52) U.S. Cl. ................................. 438/151; 257/E21.372
(58) Field of Classification Search ................ 438/149, 438/151; 257/E21.094, E21.104, E21.121, 257/E21.372, E21.411, E21.416
See application file for complete search history.

(56) References Cited

U.S. PATENT DOCUMENTS 7,133,102 B2 *   11/2006   Choi et al. ............ 349/139
* cited by examiner

*Primary Examiner* — Quoc D Hoang
(74) *Attorney, Agent, or Firm* — Cantor Colburn LLP

(57) ABSTRACT

A thin-film transistor ("TFT") substrate includes an insulating substrate, a gate line and a data line which are insulated from each other, disposed on the insulating substrate and are arranged in a lattice, and a pixel electrode which is electrically connected to the gate line and the data line by a switching device. The data line includes a lower layer which is formed of a transparent electrode, and an upper layer which is disposed directly on the lower layer.

11 Claims, 15 Drawing Sheets

THIN-FILM TRANSISTOR SUBSTRATE AND METHOD OF FABRICATING THE SAME

This application claims priority to Korean Patent Application No. 10-2008-0109411 filed on Nov. 5, 2008, and all the benefits accruing therefrom under 35 U.S.C. §119, the disclosure of which is incorporated herein by reference in its entirety.

BACKGROUND OF THE INVENTION

1. Field of the Invention

The present invention relates to a thin-film transistor ("TFT") substrate and a method of fabricating the same, and more particularly, to a TFT substrate which is structured to enhance performance and processing efficiency and a method of fabricating the TFT substrate.

2. Description of the Related Art

As modern society becomes more dependent on sophisticated information and communication technology, the market needs for larger and thinner display devices are growing. In particular, since conventional cathode ray tubes ("CRTs") have failed to fully satisfy these market needs, the demand for flat panel displays ("FPDs"), such as plasma display panels ("PDPs"), plasma address liquid crystal display panels ("PALCs"), liquid crystal displays ("LCDs"), and organic light emitting diodes ("OLEDs"), is exploding.

A conventional display device includes a lower substrate which has an array of thin-film transistors ("TFTs"), an upper substrate which faces the lower substrate, and a liquid crystal layer which is interposed between the lower and upper substrates. The display device displays images by controlling the intensity of an electric field applied to the liquid crystal layer. The display device includes a gate driver and a data driver, which drive a display panel.

Since a plurality of TFTs are formed on the lower substrate, the lower substrate is also referred to as a TFT substrate. The TFT substrate is formed by patterning a plurality of thin-film patterns. Thin-film patterns are patterned by a photolithography process, which is accompanied by the processes of coating photoresist, mask alignment, exposure, baking, developing, and washing. To form the TFT substrate, the above processes may be combined in various ways.

In particular, if a semiconductor layer and data wiring are etched simultaneously by using a single mask, the semiconductor layer remains under the data wiring.

If the semiconductor layer remains under the data wiring, an aperture ratio may be reduced, or an afterimage may be formed as the semiconductor layer becomes conductive. Therefore, a TFT substrate, which is structured to enhance processing efficiency while removing a semiconductor layer under data wiring, and a method of fabricating the TFT substrate are required.

BRIEF SUMMARY OF THE INVENTION

Exemplary embodiments of the present invention provide a thin-film transistor ("TFT") substrate which is structured to enhance performance and processing efficiency.

Exemplary embodiments of the present invention also provide a method of fabricating a TFT substrate which is structured to enhance performance and processing efficiency.

In an exemplary embodiment of the present invention, there is provided a TFT substrate including an insulating substrate, a gate line and a data line which are insulated from each other, disposed on the insulating substrate and arranged in a lattice, and a pixel electrode which is connected to the gate line and the data line by a switching device. The data line includes a lower layer which is formed of a transparent electrode, and an upper layer which is disposed directly on the lower layer.

In an exemplary embodiment, there is provided a method of fabricating a TFT substrate. The method includes forming a gate line on an insulating substrate and forming a gate pad by extending an end of the gate line, forming a gate insulating film on the gate line and the gate pad, forming a data line, and forming a pixel electrode which is connected to the gate line and the data line by a switching device. The gate line and the data line are arranged in a lattice. The data line is formed by stacking a transparent conductive layer on the gate insulating film, forming a data conductive layer on the transparent electrode layer, and simultaneously patterning the transparent conductive layer and the data conductive layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
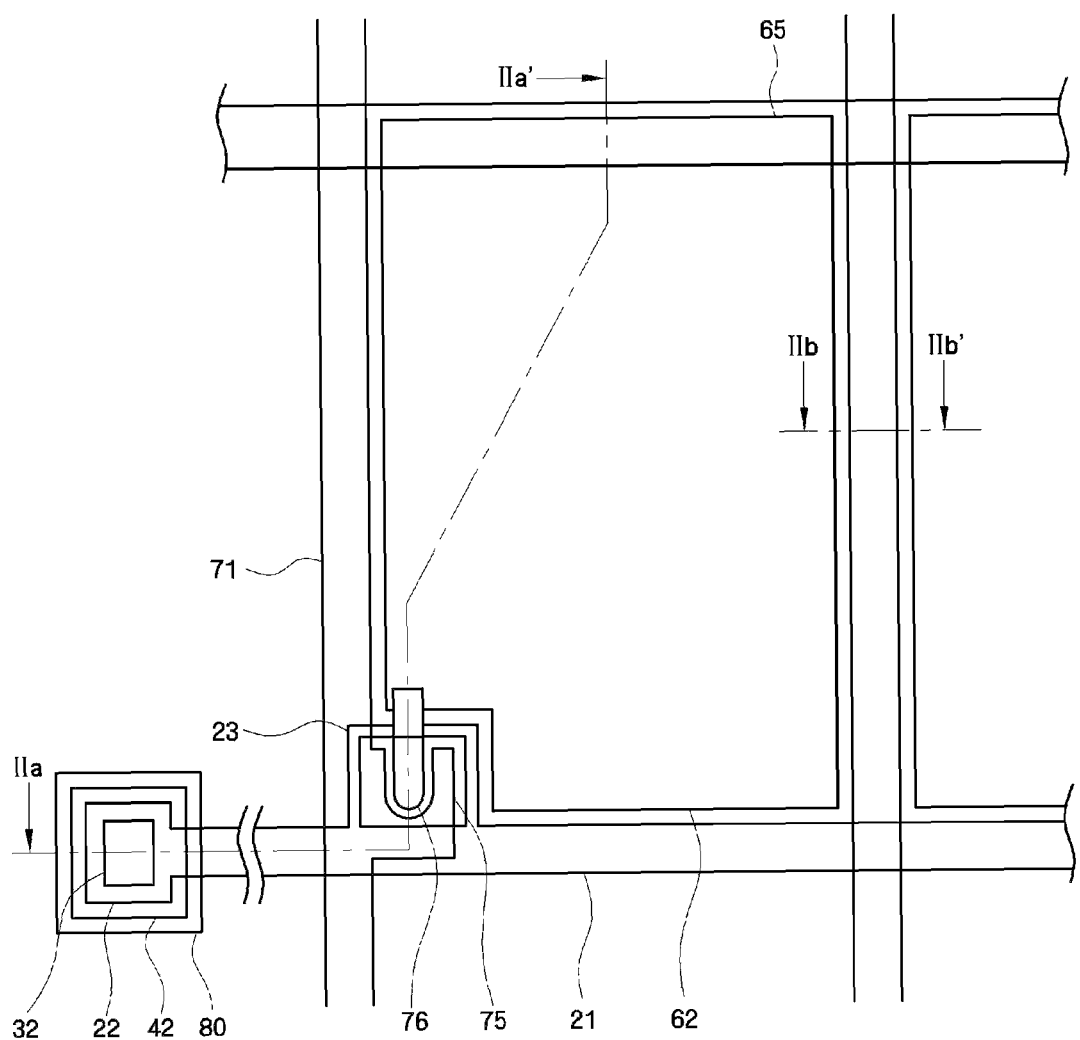
FIG. 1 is an arrangement plan of a first exemplary embodiment of a thin-film transistor ("TFT") substrate, according to the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2A:
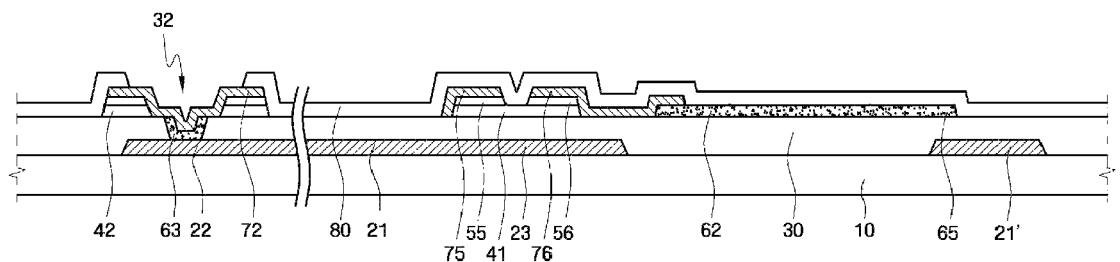
FIG. 2A is a cross-sectional view of the TFT substrate taken along line IIa-IIa' of FIG. 1.
Figure 2B:
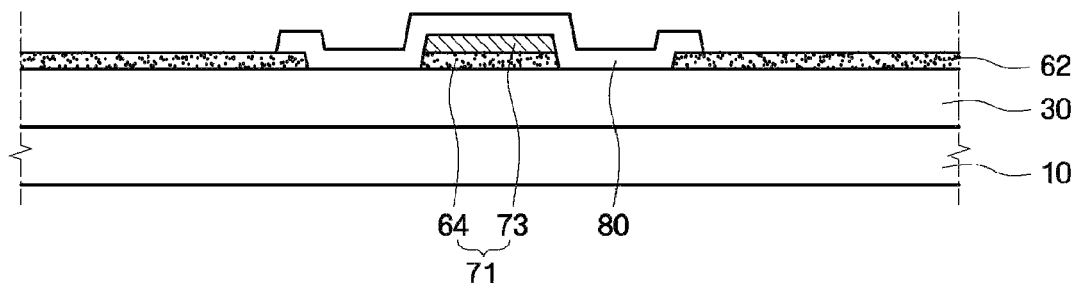
FIG. 2B is a cross-sectional view of the TFT substrate taken along line IIb-IIb' of FIG. 1.

Hereinafter, a first exemplary embodiment of a thin-film transistor ("TFT") substrate according to the present invention will be described in detail with reference to FIGS. 1 through 2B. FIG. 1 is an arrangement plan of the first exemplary embodiment of the TFT substrate according to the present invention. FIG. 2A is a cross-sectional view of the TFT substrate taken along line IIa-IIa' of FIG. 1. FIG. 2B is a cross-sectional view of the TFT substrate taken along line IIb-IIb' of FIG. 1.

Referring to FIGS. 1 through 2B, a gate line 21, a gate pad 22, and a gate electrode 23 are disposed on an insulating substrate 10, which may be made of transparent glass.

The gate line 21 extends in a first (e.g., horizontal direction in a plan view of the TFT substrate) and delivers a gate signal. A plurality of a gate line identical to the gate line 21 are disposed on the insulating substrate 10, and extend substantially parallel to each other in the same first direction. In the plan view of the TFT substrate, the gate pad 22 is wider than the gate line 21 in a second (e.g., vertical direction) and disposed at a (distal) end of each of the plurality of the gate line, i.e., the gate line 21. The second direction may be substantially perpendicular to the first direction.

The gate electrode 23 is defined by a protruding portion of the gate line 21. The gate electrode 23 extends from a first (main) portion of the gate line 21, and in the second direction. A plurality of a gate electrode identical to the gate electrode 23 may be electrically and physically connected to a single one of the gate line 21. The gate line 21, the gate pad 22, and the gate electrode 23 are collectively referred to as gate wiring.

The gate wiring may include aluminum (Al)-based metal such as Al or Al alloy, silver (Ag)-based metal such as Ag or Ag alloy, copper (Cu)-based metal such as Cu or Cu alloy, molybdenum (Mo)-based metal such as Mo or Mo alloy, chrome (Cr), titanium (Ti), or tantalum (Ta). In addition, the gate wiring may include a multi-layer structure composed of two conductive layers (not shown) with different physical characteristics. In an exemplary embodiment, one of the two conductive layers may include metal with relatively low resistivity, such as Al-based metal, Ag-based metal or Cu-based metal, in order to reduce a signal delay or a voltage drop of the gate wiring. The other one of the two conductive layers may include a material having superior contact characteristics with other materials, such as Mo-based metal, Cr, Ti, or Ta. Exemplary embodiments of the multi-layer structure include a combination of a Cr lower layer and a Cu upper layer, and a combination of a Ti lower layer and a Mo upper layer. However, the present invention is not limited thereto. The gate wiring may be made of various metals and conductors.

Referring to FIGS. 2A and 2B, a gate insulating film 30 is disposed on the gate wiring (e.g., gate line 21, the gate pad 22, and the gate electrode 23), excluding a contact hole 32 which exposes the gate pad 22. The gate insulating film 30 insulates the gate wiring from a data line 71, which may also be referred to as data wiring, which will be described later. The gate insulating film 30 is interposed between the gate wiring and the data line 71 in regions where the gate wiring overlaps the data line 71. In an exemplary embodiment, the gate insulating film 30 may include silicon nitride (SiNx).

The gate insulating film 30 is disposed on an entire surface of the insulating substrate 10, excluding an area where the contact hole 32 is disposed on and overlapping the gate pad 22. The gate insulating film 30 is not disposed in an area of the contact hole 32 since the gate pad 22 is directly contacted by other elements of the TFT substrate to be electrically connected to the gate wiring.

A semiconductor layer 41, and ohmic contact layers 55 and 56 are disposed on and directly contacting an upper surface of the gate insulating film 30. The semiconductor layer 41 may include hydrogenated amorphous silicon, and the ohmic contact layers 55 and 56 may include silicide or n+ hydrogenated amorphous silicon, which is doped with n-type impurities in a relatively high concentration.

The semiconductor layer 41 forms a channel region of each TFT. The channel region is defined by a portion of the semiconductor layer 41 which overlaps the gate electrode 23, such as in the plan and cross-sectional views of the TFT substrate. Except for the channel region, the ohmic contact layers 55 and 56 as a whole may have substantially the same pattern as the semiconductor layer 41. As illustrated in FIG. 2A, edges or boundaries of the ohmic contact layers 55 and 56 substantially coincide with edges or boundaries of the semiconductor layer 41. The ohmic contact layers 55 and 56 are separated from each other by the channel region, which overlaps the gate electrode 23. The ohmic contact layers 55 and 56 are disposed directly on the semiconductor layer 41.

The semiconductor layer 41 may have various shapes. In an exemplary embodiment, the semiconductor layer 41 may be shaped like an island, or may be substantially linear. When the semiconductor layer 41 is shaped like an island, as illustrated in FIGS. 1 and 2A, the semiconductor layer 41 may be disposed above (e.g., overlapping) the gate electrode 23.

A source electrode 75 and a drain electrode 76 are disposed on the semiconductor layer 41 and the ohmic contact layers 55 and 56. Both the source electrode 75 and the drain electrode 76 contact an upper surface of the ohmic contact layers 55 and 56, and contact side edge surfaces of both the ohmic contact layers 55 and 56 and the semiconductor layer 41. The source and drain electrodes 75 and 76 are separated from each other by a distance corresponding to a length of the channel region, and the gate electrode 23 is disposed under and overlapping the semiconductor layer 41. The source electrode 75, the drain electrode 76, the gate electrode 23, and the semiconductor layer 41 define a TFT.

Referring to FIG. 2A, a gate pad extension portion 72 is disposed along the contact hole 32 overlapping the gate pad 22. The gate pad extension portion 72 may be wider than the gate pad 22, such as in the first direction. A connection electrode 63 may be disposed between the gate pad extension portion 72 and the gate pad 22. The connection electrode 63 electrically connects the gate pad extension portion 72 to the gate pad 22 through the contact hole 32. The contact hole 32 is disposed through the gate insulating film, such as by cutting and removing a portion of the gate insulating film 30. In an exemplary embodiment, the connection electrode 63 may be a transparent electrode.

A semiconductor pattern 42 is disposed between the gate pad extension portion 72 and the gate pad 22, and overlaps at least a portion of the gate pad extension portion 72. In a manufacturing process, the semiconductor pattern 42 may be formed at substantially the same time as both the semiconductor layer 41 and the ohmic contact layers 55 and 56. The gate pad extension portion 72 is a single and continuous member which contacts an upper surface of the ohmic contact layers 55 and 56, and contact inner side surfaces of both the ohmic contact layers 55 and 56 and of the semiconductor pattern 42, as shown in FIG. 2A.

Referring to the plan view of FIG. 1, the data line 71 extends in the second (e.g., vertical direction) and crosses the gate line 21. A plurality of a data line identical to the data line 71, and a plurality of a gate line identical to the gate line 21 are arranged in a lattice. In an exemplary embodiment, the plurality of gate lines 21 and the plurality of data lines 71 may define a plurality of pixels or pixel regions, but the present invention is not limited thereto.

Each pixel of the plurality of pixels, includes a TFT including the gate electrode 23, the source electrode 75, and the drain electrode 76 as its three terminals. The source electrode 75 may be defined by a protruding portion of the data line 71. The source electrode 75 extends from a first (main) portion of the data line 71, and in the first direction from the first portion of the data line 71. As shown in FIG. 1, the drain electrode 75 includes a U-shaped portion, and a first end of the drain electrode 75 is disposed between distal ends of the U-shaped portion. The drain electrode 76 is separated from the source electrode 75 by the channel region interposed between the drain electrode 76 and the source electrode 75. The drain electrode 76 faces the source electrode 75, as illustrated in FIGS. 1 and 2A. Each TFT is a switching device and electrically connects the gate line 21, the data line 71, and a pixel electrode 62 to each other. In addition, each TFT switches on/off the pixel electrode 62 in response to a gate signal.

Referring to FIG. 2B, the data line 71 may include an upper layer 73 and a lower layer 64. In the illustrated embodiment, the lower layer 64 may be a transparent electrode such as indium tin oxide ("ITO") or indium zinc oxide ("IZO"), and the upper layer 73 may be made of a conductive material which includes at least one of Mo, Ti, Cr, tungsten (W), Al, and Cu.

Since the lower layer 64 of the data line 71 of the illustrated embodiment is a transparent electrode, even when the lower layer 64 is wider in a dimension taken perpendicular to a longitudinal direction of the data line 71 than the upper layer 73, the wider lower layer 64 does not affect an aperture ratio of each pixel. In addition, when the lower layer 64 is a transparent electrode, the lower layer 64 does not affect each TFT. Furthermore, since there is no semiconductor layer remaining under the data wiring, an aperture ratio is not reduced and an afterimage is not formed due to the semiconductor layer becoming conductive. Advantageously, the formation of afterimages is significantly reduced as compared to when the lower layer 64 of the data line 71 is made of a semiconductor material.

In an exemplary embodiment, the source electrode 75, the drain electrode 76, the gate pad extension portion 72, and the upper layer 73 of the data line 71 may be made of the same material, and may be formed at substantially a same time during a same process.

A second end of the drain electrode 76 opposing the first end, is electrically connected to the pixel electrode 62. As illustrated in FIGS. 1 and 2A, the drain electrode 76 is disposed overlapping a portion of the pixel electrode 62, such as an edge or boundary of the pixel electrode 62.

The pixel electrode 62 may be a transparent electrode, such as ITO or IZO. Each of a plurality of a pixel electrode 62, may overlap a single one of a plurality of a pixel region. In one exemplary embodiment, the pixel region may be substantially square-shaped, and may be defined by the gate line 21 and the data line 71 arranged in a lattice. A single continuous pixel electrode 62 may substantially overlap the square-shaped pixel region.

The pixel electrode 62 is disposed directly on the gate insulating film 30, and at least a portion of the pixel electrode 62 contacts and overlaps with the drain electrode 76.

As illustrated in FIGS. 1 and 2A, another portion of the pixel electrode 62 may overlap a previous gate line 21', such as to form a storage capacitor. Each pixel electrode 62 may include a protruding electrode 65 which overlaps a portion of the previous gate line 21'. Like the pixel electrode 62, the protruding electrode 65 may include a transparent electrode. The protruding electrode 65 and the previous gate line 21' may form a storage capacitor.

A passivation layer 80 is disposed on all regions of the gate insulating film 30, excluding regions where the gate pad 22 and the pixel electrode 62 are disposed. The passivation layer 80 is coated on all regions of the gate insulating film 30, excluding the regions where the pixel electrode 62 and the gate pad 22 are disposed, and protects components disposed in the coated regions. The passivation layer 80 may expose a portion of the pixel electrode 62 and may not necessarily expose the entire pixel electrode 62. In an exemplary embodiment, the passivation layer 80 may be formed by using a sputter film.

Figure 3A:
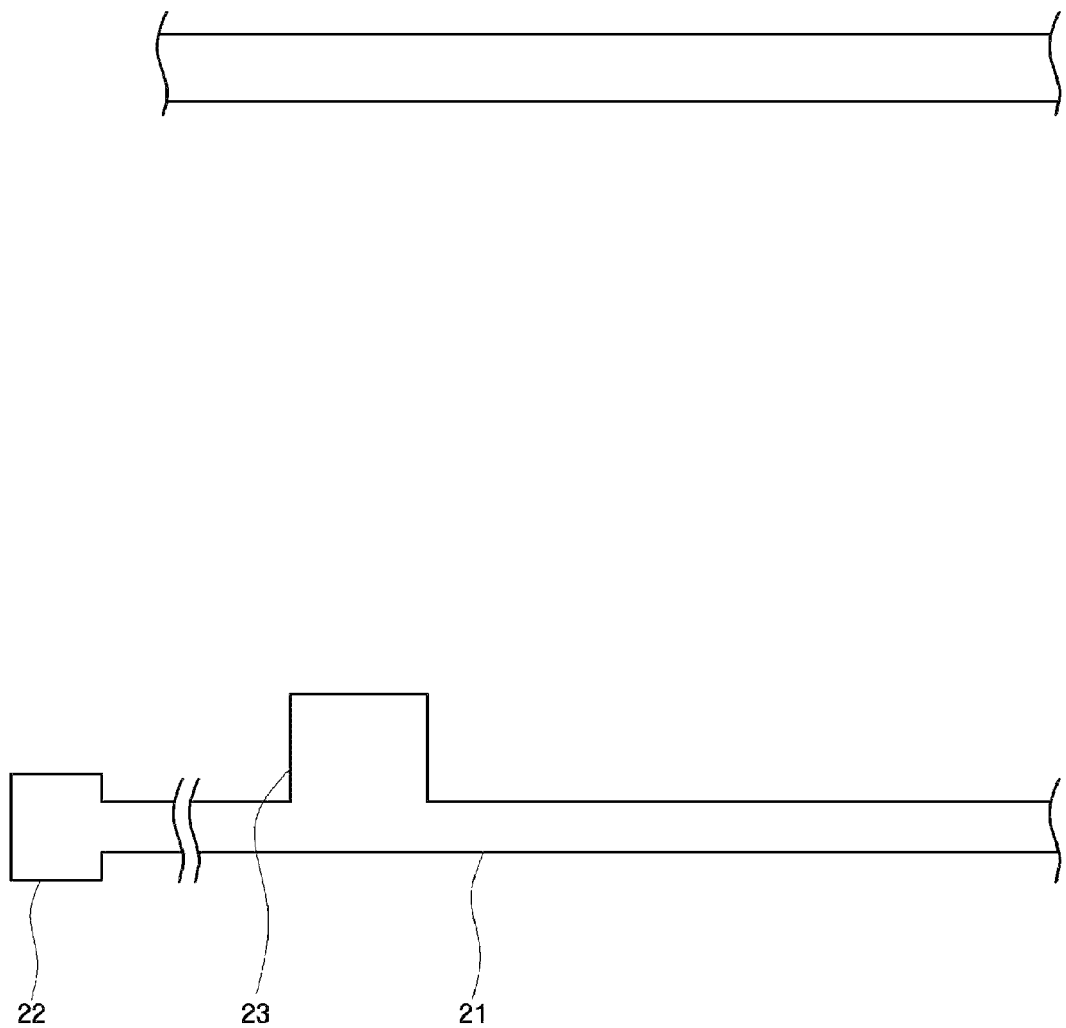
FIGS. 3A through 3C are arrangement plans for explaining processes included in an exemplary embodiment of a method of fabricating the TFT substrate of FIG. 1 according to the present invention.
Figure 3B:
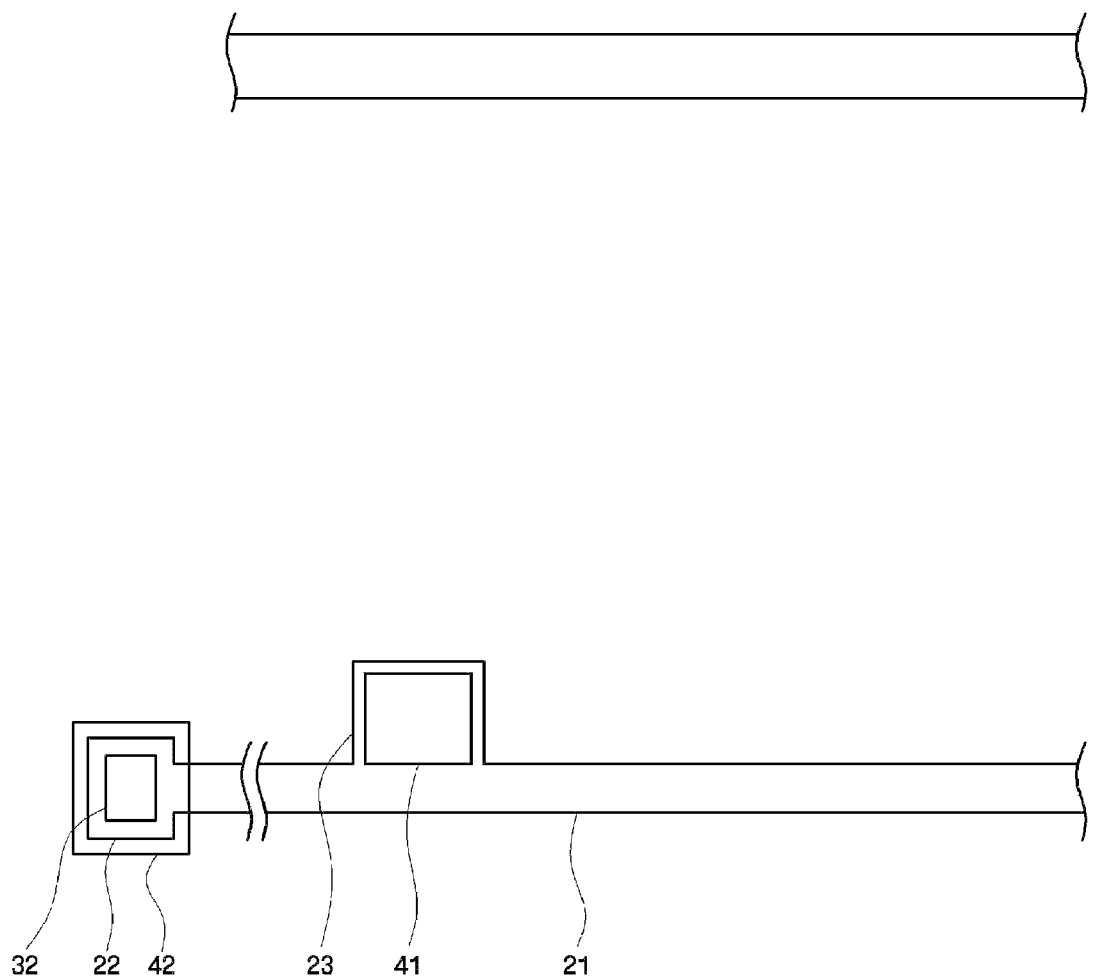
Figure 3C:
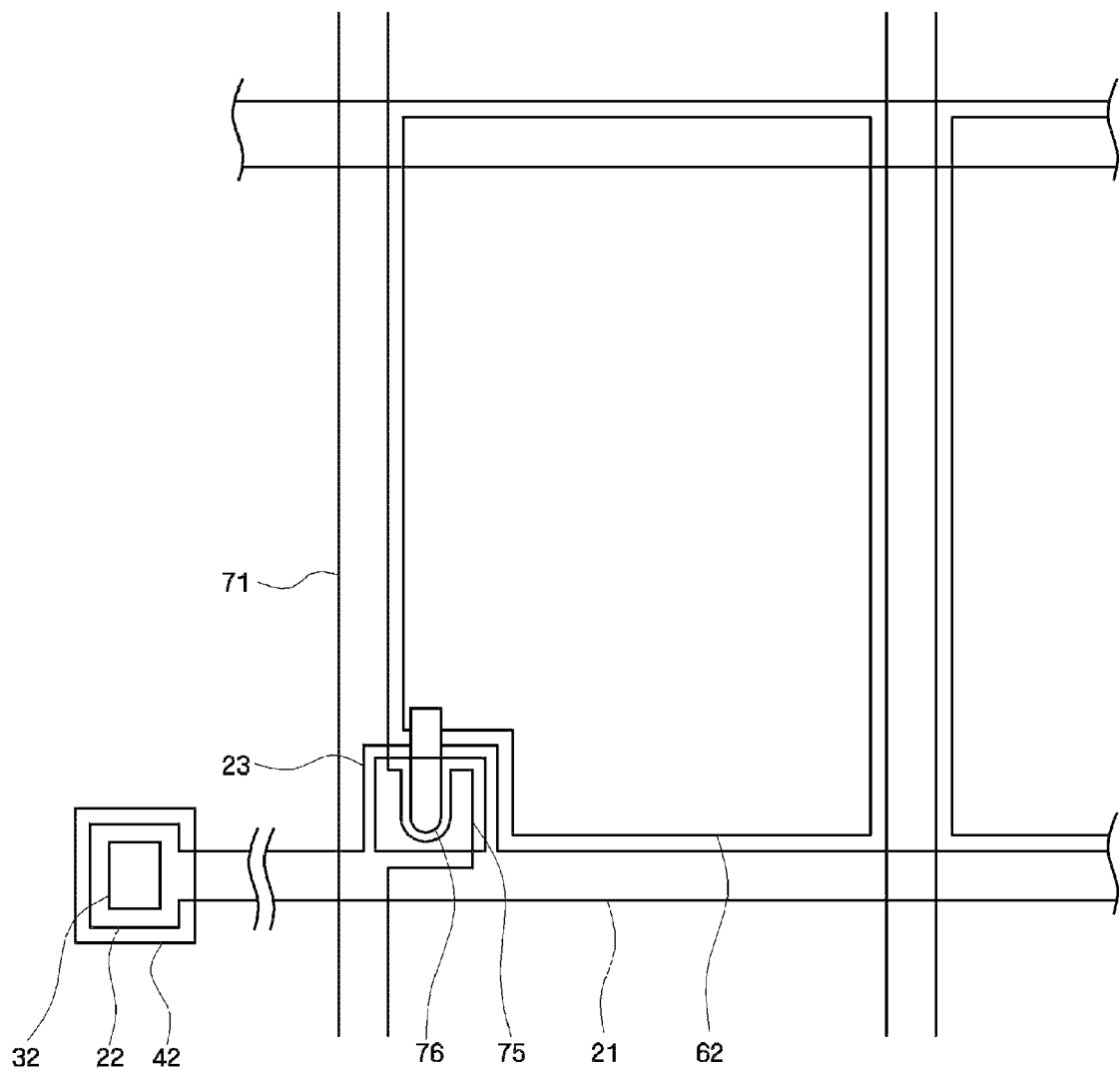
Figure 4:
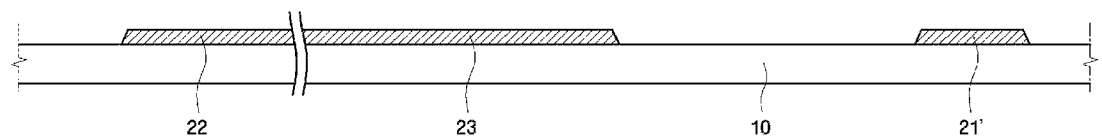
FIGS. 4 through 13 are cross-sectional views for explaining the processes included in the method of fabricating the TFT substrate of FIG. 1, according to the present invention.

Hereinafter, an exemplary embodiment of a method of fabricating the TFT substrate of FIG. 1 according to the present invention will be described in detail with reference to FIGS. 3A through 13. FIGS. 3A through 3C are arrangement plans for explaining processes included in the method of fabricating the TFT substrate of FIG. 1 according to the exemplary embodiment of the present invention. FIGS. 4 and 13 are cross-sectional views for explaining the processes included in the method of fabricating the TFT substrate of FIG. 1 according to the exemplary embodiment of the present invention.

Referring to FIGS. 3A and 4, the gate line 21 and the gate pad 22 are formed on the insulating substrate 10. In one exemplary embodiment, a gate conductive layer is deposited on the insulating substrate 10 by sputtering. A photolithography process is performed on the deposited gate conductive layer to form the gate line 21 and the gate pad 22.

Figure 5:
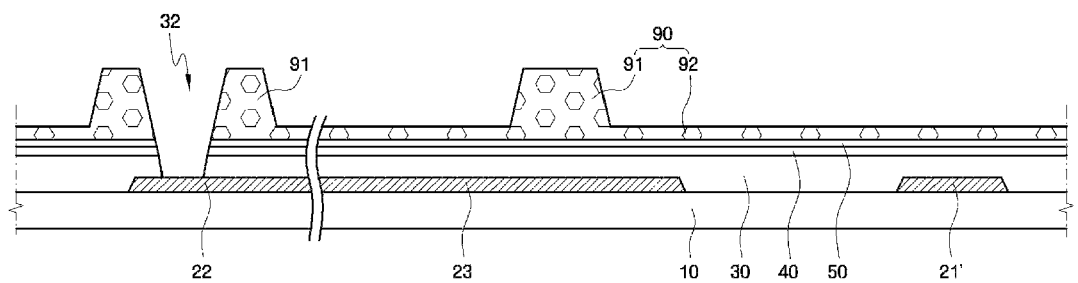

Referring to FIG. 5, the gate insulating film 30, a first amorphous silicon layer 40, and a second amorphous silicon layer 50 are sequentially deposited on the resultant structure of FIGS. 3A and 4. In the illustrated embodiment, the first amorphous silicon layer 40 is made of hydrogenated amorphous silicon, and the second amorphous silicon layer 50 is made of silicide or n+ hydrogenated amorphous silicon which is doped with n-type impurities in relatively high concentration. In one exemplary embodiment, the gate insulating film 30, the first amorphous silicon layer 40, and the second amorphous silicon layer 50 may be deposited by chemical vapor deposition ("CVD").

A first photoresist pattern 90 is formed on the gate insulating film 30, the first amorphous silicon layer 40, and the second amorphous silicon layer 50. The first photoresist pattern 90 includes a first region 91 and a second region 92 having different thicknesses taken in a direction substantially perpendicular to the insulating substrate 10. In an exemplary embodiment, the first and second regions 91 and 92 may be formed to different thicknesses by using a slit mask or a halftone mask. The first region 91 of the photoresist pattern 90 is where the semiconductor layer 41 (see FIG. 2A) and the semiconductor pattern 42 (see FIG. 2A) are disposed, and may be thicker than the second region 92.

Referring to FIG. 5, the first photoresist pattern 90 is not formed in a region where the contact hole 32, which exposes the gate pad 22, is to be formed.

The gate insulating film 30, the first amorphous silicon layer 40, and the second amorphous silicon layer 50 are sequentially etched by using the first photoresist pattern 90 as an etching mask to form the contact hole 32 which exposes the gate pad 22.

Figure 6:
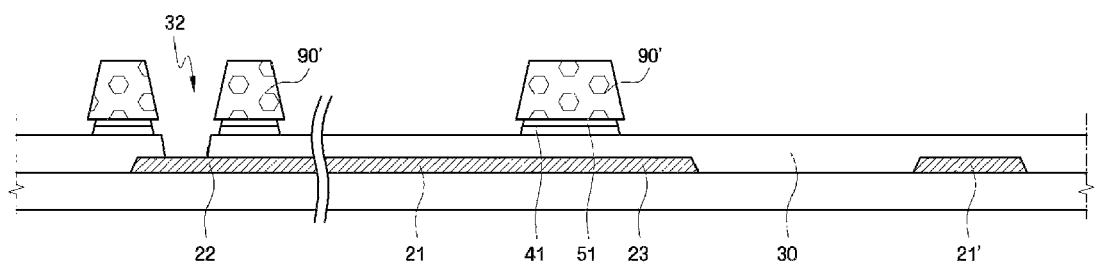

Referring to FIGS. 3B and 6, the first photoresist pattern 90 (see FIG. 5) is etched back to downsize the first photoresist pattern 90, and reduce the thicknesses of the first and second regions 91 and 92. In the illustrated embodiment, the second region 92 (see FIG. 5) of the first photoresist pattern 90 is essentially completely removed by an ashing process. The downsized first photoresist pattern 90 (indicated by reference numeral 90' in FIG. 6) remains on the semiconductor layer 41 and the semiconductor pattern 42, and has a thinner thickness than an original thickness of the first region 91 of the first photoresist pattern 90.

A photolithography process is performed by using the downsized first photoresist pattern 90' as an etching mask to form the final semiconductor layer 41 and a final amorphous silicon pattern 51. In the illustrated embodiment, the original first amorphous silicon layer 40 (see FIG. 5) and the original second amorphous silicon layer 50 (see FIG. 5) are removed by a photolithography process performed thereon, excluding a region where an active layer is to be formed above the gate electrode 23 of each pixel, and excluding a region where the gate pad 22 is formed. The first amorphous silicon layer 40 is etched to form the semiconductor layer 41 and the semiconductor pattern 42, and the second amorphous silicon layer 50 is etched to form the amorphous silicon pattern 51.

In one exemplary embodiment, the first amorphous silicon layer 40 and the second amorphous silicon layer 50 may be dry-etched. The semiconductor layer 41 and the amorphous silicon pattern 51 may be etched at substantially the same time, or may be etched at different times.

Figure 7:
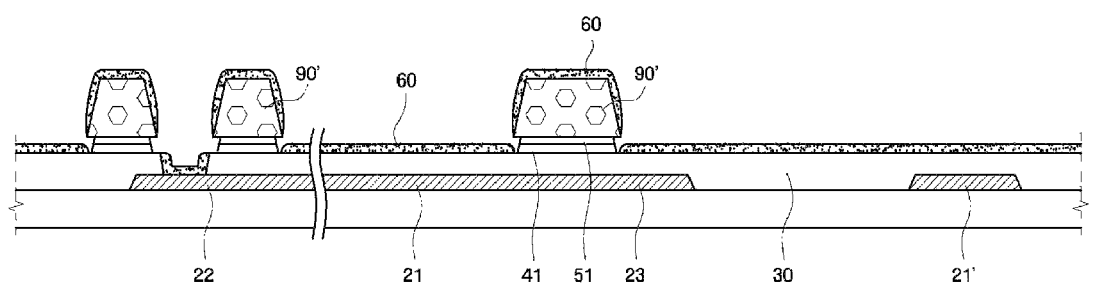

Referring to FIG. 7, a transparent conductive layer 60 is formed on the resultant structure of FIG. 6. The transparent conductive layer 60 is disposed on all regions of the resultant structure, including regions where the downsized first photoresist pattern 90 (indicated by reference numeral 90' in FIG. 7) and the contact hole 32 are disposed. The transparent conductive layer 60 may be used to ultimately form the pixel electrode 62 and the data line 71.

Figure 8:
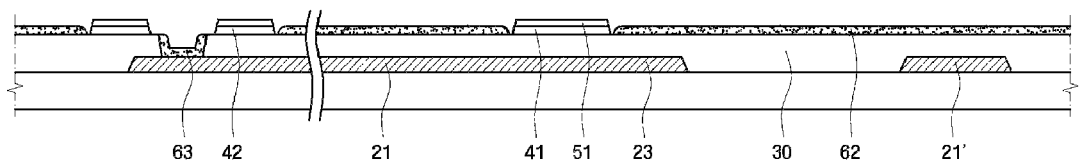

Referring to FIG. 8, the downsized photoresist pattern 90 (indicated by reference numeral 90' in FIG. 7) is removed by a lift-off process. In the illustrated embodiment, a photoresist stripper, which contains an amine-based material or a glycol-based material, is sprayed or dipped into the downsized photoresist pattern 90'. The photoresist stripper melts the downsized photoresist pattern 90' and thus exfoliates the downsized photoresist pattern 90' while also removing the transparent conductive layer 60 (see FIG. 6) disposed on the downsized photoresist pattern 90'. The removal rate of the downsized photoresist pattern 90' and the transparent conductive layer 60 disposed on the downsized photoresist pattern 90' may be determined by the contact time and the contact area of the downsized photoresist pattern 90' and the photoresist stripper.

Figure 9:
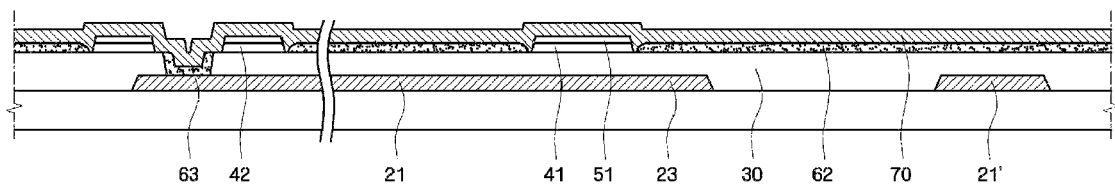

Referring to FIG. 9, a data conductive layer 70 is formed on the resultant structure of FIG. 8, such as by sputtering. The data conductive layer 70 is disposed on the entire surface of the insulating substrate 10 to cover and overlap a whole of each of the gate insulating film 30, the semiconductor layer 41, and the amorphous silicon pattern 51. The data conductive layer 70 may be used to ultimately form the source electrode 75, the drain electrode 76, the gate pad extension portion 72 and the data line 71.

Figure 10:
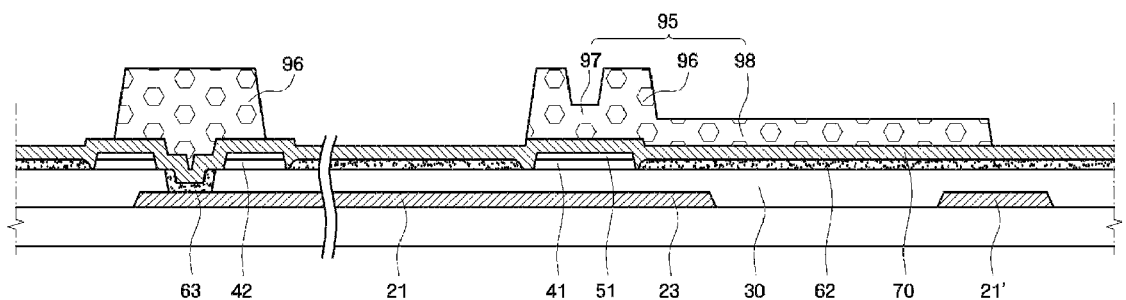

Referring to FIG. 10, a second photoresist pattern 95 is formed on the data conductive layer 70. The second photoresist pattern 95 includes a third region 96, a fourth region 97, and a fifth region 98. Here, the third through fifth regions 96 through 98 may have different thicknesses taken in the direction substantially perpendicular with the insulating substrate 10. The fourth region 97 is where the channel region is formed. The fourth region 97 may be formed between two portions of the third region 96, and may be thinner than the third region 96. The fifth region 98 overlaps the pixel electrode 62 and forms each pixel region. The fifth region 98 may be thinner than the third region 96 and may be as thick as the fourth region 97.

The third (e.g., thickest) region 96 may be formed on regions of the data conductive layer 70 where the source electrode 75 (see FIG. 2A), the drain electrode 76 (see FIG. 2A), the data line 71 (see FIG. 2B), and the gate pad extension portion 72 (see FIG. 2A) are to be formed.

Figure 11:
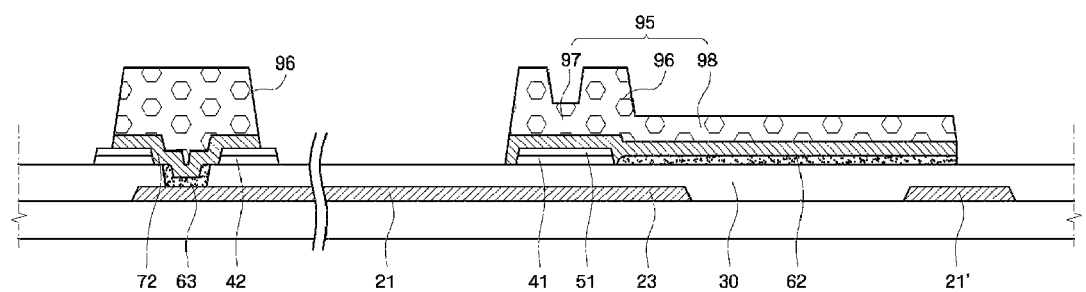

Referring to FIGS. 3C and 11, the data conductive layer 70 and the transparent conductive layer 60 are substantially simultaneously patterned by using the second photoresist pattern 95 as an etching mask. All regions of the data conductive layer 70 and the transparent conductive layer 60 are etched and thus removed, excluding regions where the third through fifth regions 96 through 98 of the second photoresist pattern 95 are formed. The data conductive layer 70 and the transparent conductive layer 60 remain only in a pixel region, a region where a TFT is formed, and a region where the gate pad 22 is formed.

Additionally, as the data conductive layer 70 and the transparent conductive layer 60 are substantially simultaneously patterned by using the second photoresist pattern 95 as an etching mask, the date line 71 is formed.

In an exemplary embodiment referring to FIG. 2B, the data line 71 may include an upper layer 73 and a lower layer 64. In the illustrated embodiment, the lower layer 64 may be a transparent electrode, such as formed from the transparent conductive layer 60, and the upper layer 73 may include a conductive material, as formed from the data conductive layer 70. Since the lower layer 64 of the data line 71 is a transparent electrode, even when the lower layer 64 is wider than the upper layer 73, the wider lower layer 64 does not affect an aperture ratio of each pixel. In addition, when the lower layer 64 is a transparent electrode, the lower layer 64 does not affect each TFT. Furthermore, since there is no semiconductor layer remaining under the data wiring, an aperture ratio is not reduced and an afterimage is not formed due to the semiconductor layer becoming conductive. Advantageously, the formation of afterimages is significantly reduced as compared to when the lower layer 64 of the data line 71 is made of a semiconductor material.

Figure 12:
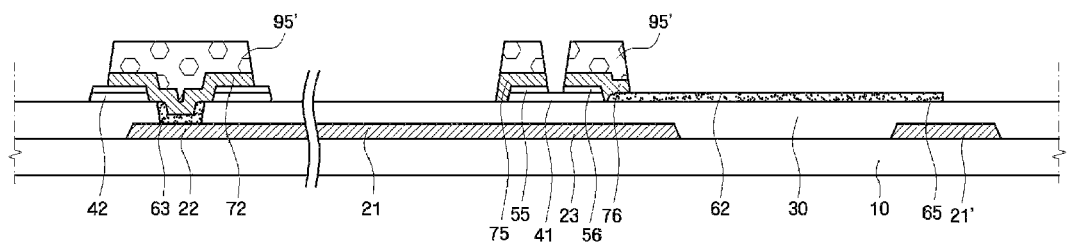
Figure 13:
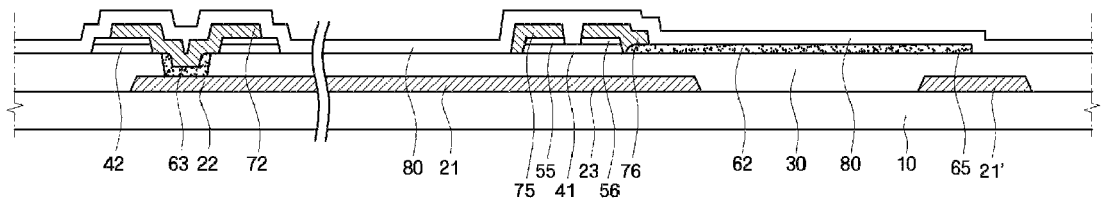

Referring to FIG. 12, the second photoresist pattern 95 (see FIG. 11) is etched back and thus downsized. A thickness of the (thickest) third region 96 is reduced from an original thickness (see FIGS. 10 and 11), and a thickness of the fourth region 97 and the fifth region 98 are essentially completely removed. In the illustrated embodiment, the fourth and fifth regions 97 and 98 of the second photoresist pattern 95 are removed by an ashing process.

The data conductive layer 70 (see FIG. 10) and the amorphous silicon pattern 51 (see FIG. 10) in the channel region are removed by using the downsized second photoresist pattern 95 (indicated by reference numeral 95' in FIG. 12) as an etching mask to form a channel. Here, the data conductive layer 70, which is disposed on and overlaps the pixel electrode 62, is also etched to expose the pixel electrode 62 and the protruding electrode 65.

Referring to FIG. 13, the passivation layer 80 is deposited on the resultant structure of FIG. 12. The passivation layer 80 may include silicon oxide (SiOx), silicon oxynitride (SiOxNy), or SiNx. In an exemplary embodiment, the passivation layer 80 may be formed by using low-temperature chemical vapor deposition ("LTCVD") and sputtering.

Referring to FIG. 2A, the passivation layer 80 is etched to expose the gate pad extension portion 72.

Figure 14:
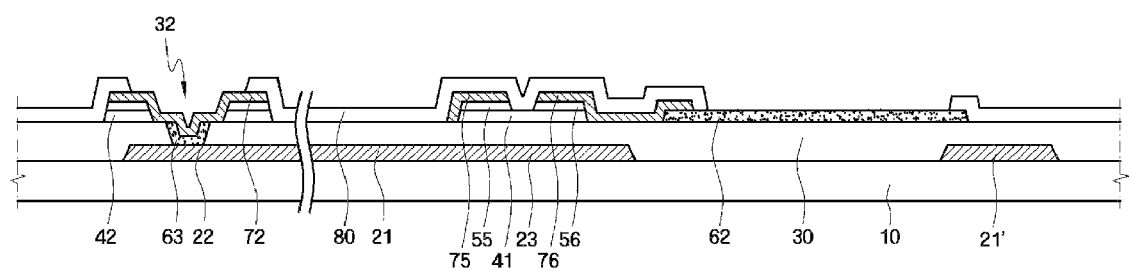
FIG. 14 is a cross-sectional view of a second exemplary embodiment of a TFT substrate, according to the present invention.

Hereinafter, a second exemplary embodiment of a TFT substrate according to the present invention will be described in detail with reference to FIG. 14. FIG. 14 is a cross-sectional view of the second exemplary embodiment of the TFT substrate according to the present invention. For simplicity, elements substantially identical to those of the first exemplary embodiment are indicated by like reference numerals, and thus their description will be omitted.

The TFT substrate according to the illustrated embodiment is a modified embodiment of the TFT substrate shown in FIG. 2A. On the TFT substrate of FIG. 14, a passivation layer 80 disposed on a pixel electrode 62 is removed, and an area of the pixel electrode 62 and the protruding electrode 65 is exposed.

When the passivation layer 80 on the pixel electrode 62 is removed, an effective voltage applied to the pixel electrode 62 can be increased. Advantageously, a liquid crystal layer (not shown) can be driven at a low voltage.

The processes of FIGS. 4 through 12 performed to fabricate the TFT substrate according to the first exemplary embodiment (FIG. 1) may also be used to fabricate the TFT substrate according to the second exemplary embodiment (FIG. 14).

Referring again to FIG. 13, the passivation layer 80 is disposed on the entire surface of the resultant structure of FIG. 12.

Then, the passivation layer 80 is etched to expose a gate pad extension portion 72 and the pixel electrode 62 including the protruding electrode 65.

Figure 15:
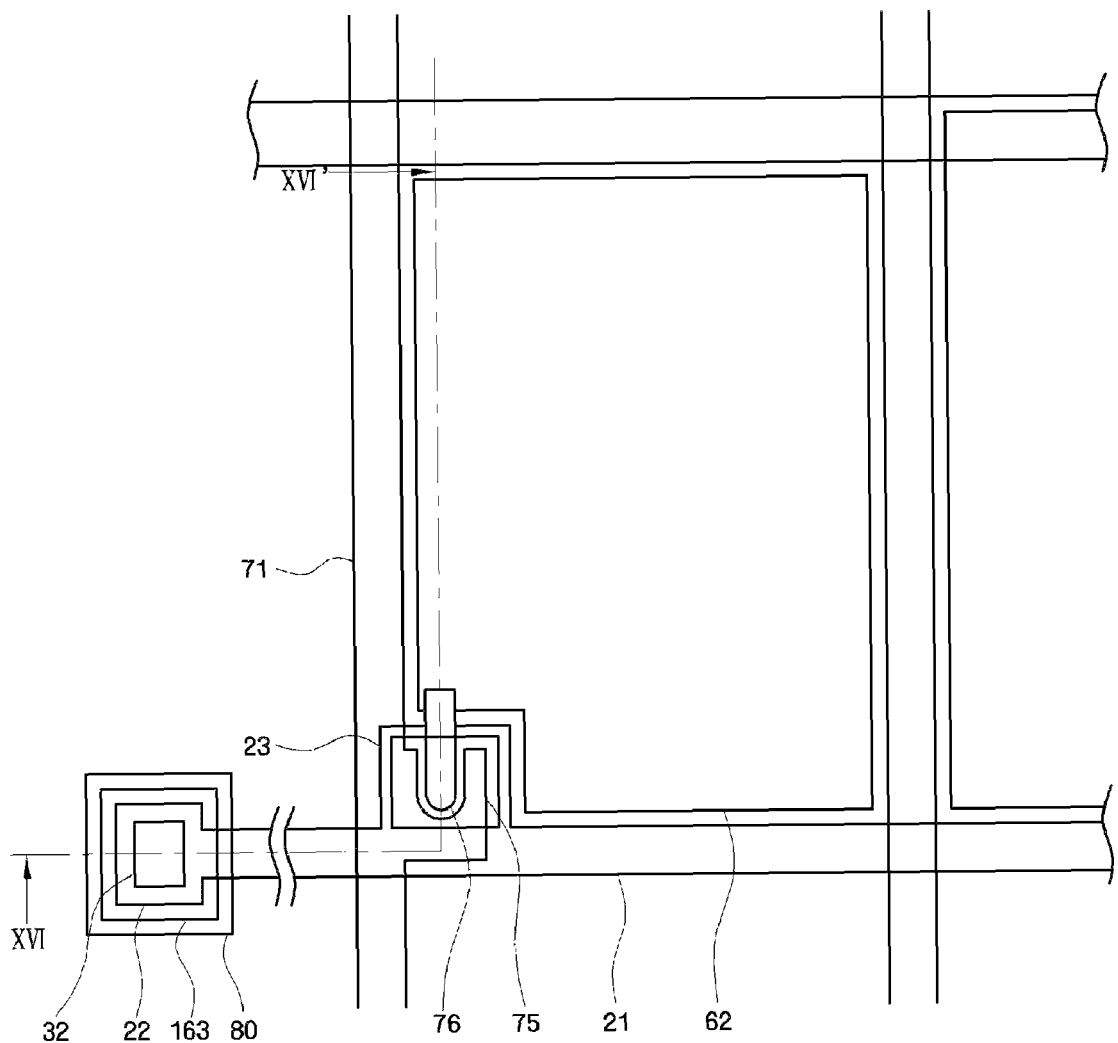
FIG. 15 is an arrangement plan of a third exemplary embodiment of a TFT substrate, according to the present invention.
Figure 16:
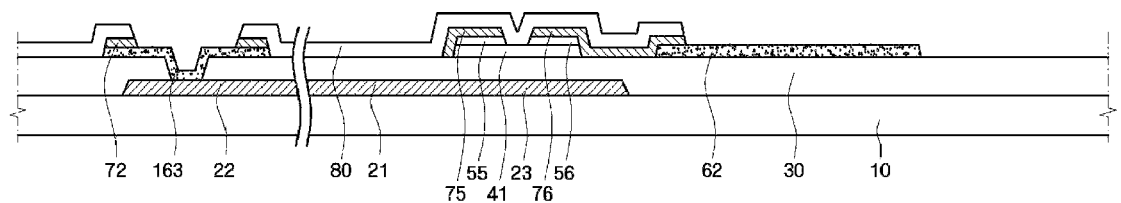
FIG. 16 is a cross-sectional view of the TFT substrate taken along line XVI-XVI' of FIG. 15.

Hereinafter, a third exemplary embodiment of a TFT substrate according to the present invention will be described in detail with reference to FIGS. 15 through 16. FIG. 15 is an arrangement plan of the TFT substrate according to the third exemplary embodiment of the present invention. FIG. 16 is a cross-sectional view of the TFT substrate taken along the line XVI-XVI' of FIG. 15. For simplicity, elements substantially identical to those of the first exemplary embodiment are indicated by like reference numerals, and thus their description will be omitted.

The third exemplary embodiment of the TFT substrate a gate pad extension portion 163 which is formed on a gate pad 22 as a transparent electrode. The gate pad extension portion 163 is exposed between portions of a passivation layer 80 and a semiconductor pattern. Portions of the passivation layer 80 and the semiconductor pattern which overlap the gate pad 22, may be removed during a manufacturing process to expose the gate pad extension portion 163.

A gate line 21, the gate pad 22, and a gate electrode 23 are disposed on an insulating substrate 10.

The gate pad extension portion 163 is disposed directly on and contacting the gate pad 22. In the illustrated embodiment, the gate pad extension portion 163 may be a transparent electrode. The gate pad extension portion 163 and a pixel electrode 62 may include the same material and/or may be formed in the same process.

Referring again to FIG. 16, the passivation layer 80 is disposed above the gate pad extension portion 163, such as to define an uppermost layer of the TFT substrate. A portion of the passivation layer 80, which overlaps edges and boundaries of the gate pad extension portion 163, may be removed to expose a portion of the gate pad extension portion 163.

Hereinafter, an exemplary embodiment of a method of fabricating the TFT substrate of the third exemplary embodiment will be described in detail with reference to FIGS. 17 through 21. FIGS. 17 through 21 are cross-sectional views for explaining processes included in a method of fabricating the TFT substrate of FIGS. 15 and 16.

Figure 17:
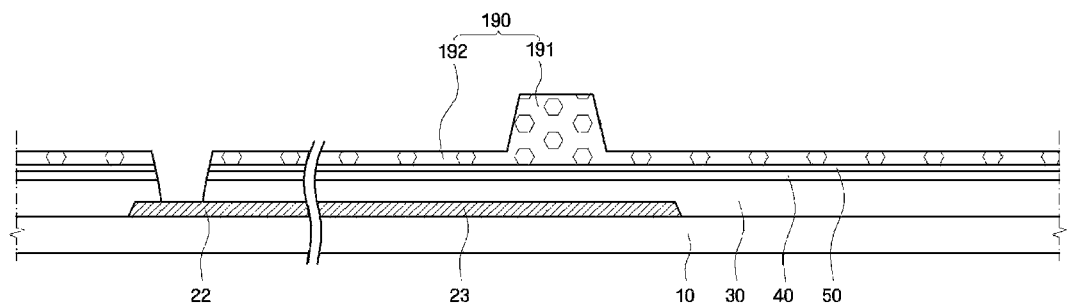
FIGS. 17 through 21 are cross-sectional views for explaining processes included in an exemplary embodiment of a method of fabricating the TFT substrate of FIGS. 15 and 16, according to the present invention.

Referring to FIG. 17, the gate line 21 and the gate pad 22 are formed directly on the insulating substrate 10. In one exemplary embodiment, a gate conductive layer is deposited on the insulating substrate 10 by sputtering. A photolithography process is performed on the gate conductive layer to form the gate line 21 and the gate pad 22.

A gate insulating film 30, a first amorphous silicon layer 40, and a second amorphous silicon layer 50 are sequentially deposited. The first amorphous silicon layer 40 may include hydrogenated amorphous silicon, and the second amorphous silicon layer 50 may include silicide or n+ hydrogenated amorphous silicon which is doped with n-type impurities in high concentration.

A first photoresist pattern 190 is formed on the gate insulating film 30, the first amorphous silicon layer 40, and the second amorphous silicon layer 50. The first photoresist pattern 190 includes a first region 191 and a second region 192 having different thicknesses. In one exemplary embodiment, the first and second regions 191 and 192 may be formed to different thicknesses by using a slit mask or a halftone mask. The first region 191 is where a semiconductor layer 41 (see FIG. 16) is formed and may be thicker than the second region 192.

The first photoresist pattern 190 is not formed in a region where a contact hole 32, which exposes the gate pad 22, is to be formed.

The gate insulating film 30, the first amorphous silicon layer 40, and the second amorphous silicon layer 50 are sequentially etched by using the first photoresist pattern 190 as an etching mask to form the contact hole 32 which exposes the gate pad 22.

Figure 18:
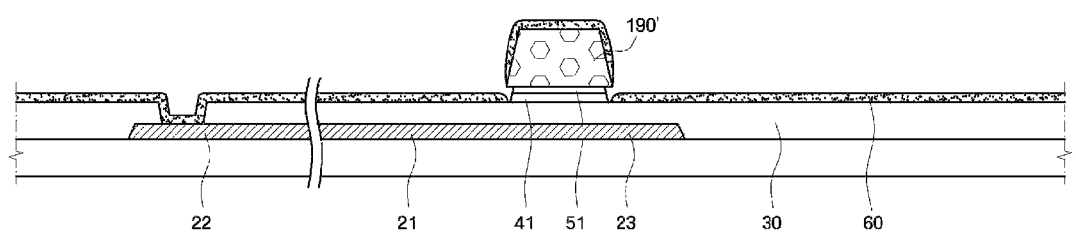

Referring to FIG. 18, the first photoresist pattern 190 (see FIG. 17) is etched back to downsize the first photoresist pattern 190. A thickness of the downsized photoresist pattern 190 in the first region 191 is larger than a thickness of the downsized photoresist pattern in the second region 192. In one exemplary embodiment, the second region 192 (see FIG. 17) of the first photoresist pattern 190 is essentially completely removed by an ashing process. The downsized first photoresist pattern 190 (indicated by reference numeral 190' in FIG. 18) remains only on the semiconductor layer 41.

A photolithography process is performed by using the downsized first photoresist pattern 190' as an etching mask to form the semiconductor layer 41 and an amorphous silicon pattern 51. The first amorphous silicon layer 40 (see FIG. 17) and the second amorphous silicon layer 50 (see FIG. 17) are removed by a photolithography process performed thereon, excluding a region where an active layer is to be formed above the gate electrode 23 of each pixel and a region where the gate pad 22 is formed. The first amorphous silicon layer 40 is etched to form the semiconductor layer 41, and the second amorphous silicon layer 50 is etched to form the amorphous silicon pattern 51.

In one exemplary embodiment, the first amorphous silicon layer 40 and the second amorphous silicon layer 50 may be dry-etched. The semiconductor layer 41 and the amorphous silicon pattern 51 may be etched at substantially the same time or at different times.

A transparent conductive layer 60 is formed on the gate insulating film 30 and the downsized first photoresist pattern 190'. The transparent conductive layer 60 is disposed on all regions of the gate insulating film 30, including regions where the downsized first photoresist pattern 190' and the contact hole 32 are formed. The transparent conductive layer 60 may be used to ultimately form the pixel electrode 62, the data line 71 and the gate pad extension portion 72.

Figure 19:
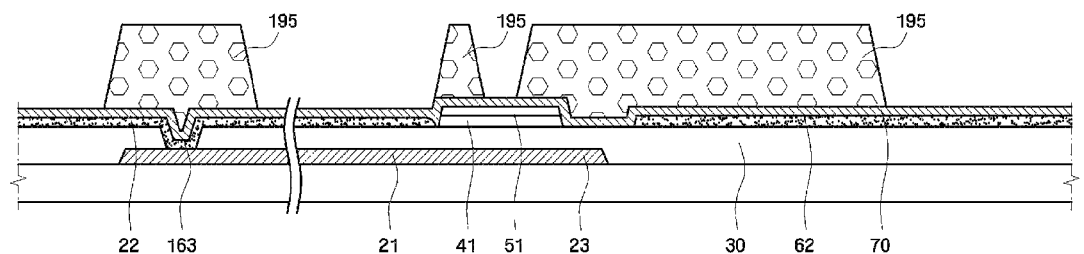

Referring to FIG. 19, the downsized photoresist pattern 190 (indicated by reference numeral 190' in FIG. 18) is removed by a lift-off process.

As the downsized first photoresist pattern 190' is removed, a portion of the transparent conductive layer 60, which is disposed on and overlaps with the semiconductor layer 41, is removed while the other portions of the transparent conductive layer 60 remain A data conductive layer 70 is disposed on the entire remaining portions of the transparent conductive layer 60 and the entire semiconductor layer 41, and a second photoresist pattern 195 is formed on the data conductive layer 70. The data conductive layer 70 may be used to ultimately form the source electrode 75, the drain electrode 76, the gate pad extension portion 72 and the data line 71.

The second photoresist pattern 195 is formed on regions of the data conductive layer 70 where a data line 71, the pixel electrode 62, a source electrode 75, a drain electrode 76, and the gate pad extension portion 163 (see FIG. 16) are formed. However, the second photoresist pattern 195 is removed from a channel region above the semiconductor layer 41.

Figure 20:
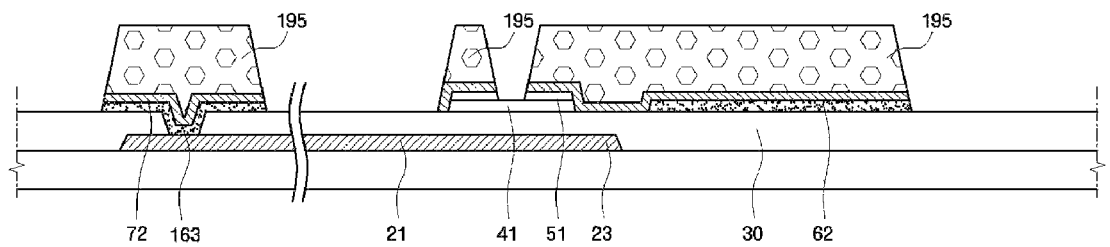

Referring to FIG. 20, the data conductive layer 70 and the transparent conductive layer 60 are patterned substantially simultaneously by using the second photoresist pattern 195 as an etching mask. All regions of the data conductive layer 70 and the transparent conductive layer 60, excluding regions where the second photoresist pattern 195 is formed, are etched and thus removed. Accordingly, the amorphous silicon pattern 51 (see FIG. 19) in the channel region is patterned to form a channel As the data conductive layer 70 and the transparent conductive layer 60 are substantially simultaneously patterned by using the second photoresist pattern 195 as an etching mask, the date line 71 is formed. In an exemplary embodiment the data line 71 may include an upper layer and a lower layer, where the lower layer may be a transparent electrode, such as formed from the transparent conductive layer 60, and the upper layer may include a conductive material, as formed from the data conductive layer 70. Since the lower layer of the data line 71 is a transparent electrode, even when the lower layer is wider than the upper layer, the wider lower layer does not affect an aperture ratio of each pixel. In addition, when the lower layer is a transparent electrode, the lower layer does not affect each TFT. Furthermore, since there is no semiconductor layer remaining under the data wiring, an aperture ratio is not reduced and an afterimage is not formed due to the semiconductor layer becoming conductive. Advantageously, the formation of afterimages is significantly reduced as compared to when the lower layer of the data line 71 is made of a semiconductor material.

Referring again to FIG. 20, the data conductive layer 70 and the amorphous silicon pattern 51 in the channel region, excluding the regions where the gate pad extension portion 72, the data line 71, the pixel electrode 62, the source electrode 75, and the drain electrode 76 are formed, are patterned and thus removed.

Figure 21:
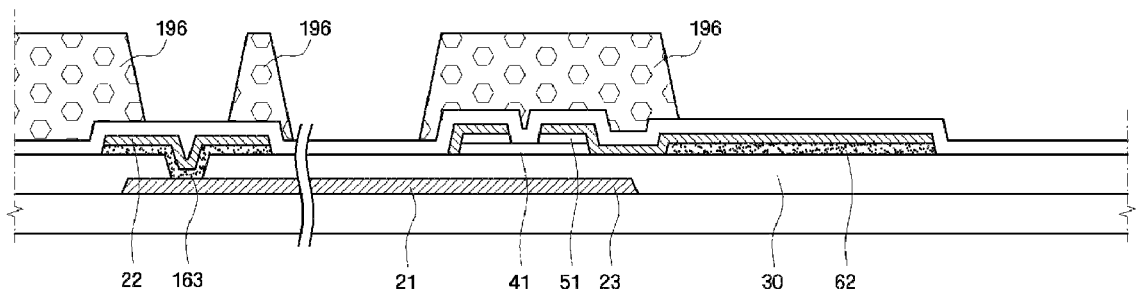

Referring to FIG. 21, the passivation layer 80 is disposed on the resultant structure of FIG. 20.

A third photoresist pattern 196 is formed on the passivation layer 80. The third photoresist pattern 196 is used as an etching mask to pattern the passivation layer 80 and is formed on all regions of the passivation layer 80, excluding regions which overlap the gate pad extension portion 163 and the pixel electrode 62.

Referring back to FIG. 16, the passivation layer 80 is patterned by using the third photoresist pattern 196 as an etching mask. Consequently, the regions of the passivation layer 80, which overlap the gate pad extension portion 163 and the pixel electrode 62, are removed.

While the present invention has been particularly shown and described with reference to exemplary embodiments thereof, it will be understood by those of ordinary skill in the art that various changes in form and detail may be made therein without departing from the spirit and scope of the present invention as defined by the following claims The exemplary embodiments should be considered in a descriptive sense only and not for purposes of limitation.

What is claimed is:

1. A method of fabricating a TFT substrate, the method comprising:
    forming a gate line on an insulating substrate, and forming a gate pad by extending an end of the gate line to be wider than the gate line in a first direction substantially perpendicular to a longitudinal direction of the gate line;
    forming a gate insulating film on the gate line and the gate pad;
    sequentially stacking a first semiconductor material layer and a second semiconductor material layer on the gate insulating film and forming a first photoresist layer on the second semiconductor material layer;
    forming a contact hole which exposes a portion of the gate line extension portion, by etching the gate insulating film, the first semiconductor material layer, and the second semiconductor material layer using the first photoresist layer as an etching mask;
    forming a data line including:
        stacking a transparent conductive layer on the gate insulating film,
        forming a data conductive layer directly on the transparent conductive layer, and
        simultaneously patterning the transparent conductive layer and the data conductive layer; and
    forming a pixel electrode which is electrically connected to the gate line and the data line by a switching device,
    wherein the gate line and the data line are arranged in a lattice.

2. The method of claim 1, wherein the switching device comprises a TFT including a gate electrode which is protruded from the gate line, a source electrode which is protruded from the data line, and a drain electrode which is electrically connected to the pixel electrode, and
    further comprising forming a semiconductor layer and ohmic contact layers, which each overlap a portion of the gate electrode, by etching back to reduce a thickness of the first photoresist layer, and etching the first semiconductor material layer and the second semiconductor material layer.

3. The method of claim 2, wherein the forming of the pixel electrode comprises:
    stacking the transparent conductive layer on remnants of the gate insulating film and remnants of the first photoresist layer; and
    lifting off the remnants of the first photoresist layer.

4. The method of claim 3, wherein the forming of the data line comprises:
    forming the data conductive layer on the transparent conductive layer and the ohmic contact layers;
    forming a second photoresist layer on the data conductive layer; and
    etching the data conductive layer by using the second photoresist layer as an etching mask.

5. The method of claim 4, further comprising exposing the pixel electrode by etching back to reduce a thickness of the second photoresist layer, and removing a portion of the data conductive layer disposed on the pixel electrode.

6. The method of claim 2, wherein a portion of the drain electrode is disposed overlapping with the pixel electrode.

7. The method of claim 2, further comprising forming a passivation layer on the TFT and the pixel electrode.

8. The method of claim 7, wherein the passivation layer exposes a portion of the pixel electrode.

9. The method of claim 2, wherein the semiconductor layer does not overlap the data line.

10. The method of claim 1, further comprising:
    forming a gate pad by widening the end of the gate line in the first direction;
    forming a gate pad extension portion overlapping the gate pad; and
    forming a connection electrode of a transparent electrode, the connection electrode connecting the gate pad to the gate pad extension portion.

11. The method of claim 10, further comprising forming a semiconductor pattern which overlaps a portion of the gate pad extension portion.

* * * * *